United States Patent
Chen et al.

(10) Patent No.: US 11,925,087 B2
(45) Date of Patent: Mar. 5, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Yipeng Chen, Beijing (CN); Ling Shi, Beijing (CN); Ke Liu, Beijing (CN); Zhenhua Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 414 days.

(21) Appl. No.: 17/426,649

(22) PCT Filed: Oct. 29, 2020

(86) PCT No.: PCT/CN2020/124642
§ 371 (c)(1),
(2) Date: Jul. 29, 2021

(87) PCT Pub. No.: WO2022/087938
PCT Pub. Date: May 5, 2022

(65) Prior Publication Data
US 2022/0320263 A1    Oct. 6, 2022

(51) Int. Cl.
*H10K 59/179*    (2023.01)
*H10K 50/822*    (2023.01)
(Continued)

(52) U.S. Cl.
CPC ......... *H10K 59/179* (2023.02); *H10K 50/822* (2023.02); *H10K 71/00* (2023.02);
(Continued)

(58) Field of Classification Search
CPC .............. H10K 59/179; H10K 59/173; H10K 59/1201; H10K 59/122; H10K 59/131; H10K 50/822; H01L 59/17
See application file for complete search history.

(56) References Cited

U.S. PATENT DOCUMENTS

| | | |
|---|---|---|
| 2018/0301521 A1 | 10/2018 | Yang |
| 2020/0251539 A1* | 8/2020 | Fu ........................ H10K 59/179 |
| 2020/0286948 A1 | 9/2020 | Qin et al. |

FOREIGN PATENT DOCUMENTS

| | | |
|---|---|---|
| CN | 106876331 A | 6/2017 |
| CN | 107170381 A | 9/2017 |

(Continued)

*Primary Examiner* — Wasiul Haider
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes: a first display region and a second display region; the first display region includes a plurality of first pixels, the first pixel includes a passive light-emitting device, the second display region includes a plurality of second pixels, the second pixel includes an active light-emitting device and a pixel drive circuit electrically connected to the active light-emitting device. The first display region further includes a plurality of first cathode blockers, and the first cathode blocker includes at least one first groove, wherein the first cathode blocker is provided between at least two adjacent columns of first pixels, to make the cathodes of the two adjacent columns of first pixels disconnected.

20 Claims, 12 Drawing Sheets

(51) Int. Cl.
*H10K 71/00* (2023.01)
*H10K 59/12* (2023.01)
*H10K 59/122* (2023.01)
*H10K 59/173* (2023.01)

(52) U.S. Cl.
CPC ....... *H10K 59/1201* (2023.02); *H10K 59/122* (2023.02); *H10K 59/173* (2023.02)

(56) References Cited

FOREIGN PATENT DOCUMENTS

| | | |
|---|---|---|
| CN | 207781599 U | 8/2018 |
| CN | 109600459 A | 4/2019 |
| CN | 110783381 A | 2/2020 |
| CN | 111584591 A | 8/2020 |
| CN | 111819693 A | 10/2020 |

* cited by examiner

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2020/124642 having an international filing date of Oct. 29, 2020, the content of which is hereby incorporated by reference.

TECHNICAL FIELD

Embodiments of the present disclosure relate to, but are not limited to, a display substrate, a preparation method thereof and a display apparatus.

BACKGROUND

A full-screen has become a main display mode of mobile phones. However, mobile phones need to be equipped with front cameras, infrared sensors and other components, which is not conducive to the design of the full-screen. It is necessary to provide the full screen which is convenient for placing cameras, infrared sensors and other components.

SUMMARY

The following is a summary of subject matter described in detail herein. This summary is not intended to limit the protection scope of the claims.

In one aspect, an embodiment of the present disclosure provides a display substrate, including: a first display region and a second display region, the first display region includes a plurality of first pixels, the first pixel includes a passive light-emitting device, the second display region includes a plurality of second pixels, the second pixel includes an active light-emitting device and a pixel drive circuit electrically connected to the active light-emitting device. The first display region further includes a plurality of first cathode blockers, and the first cathode blocker includes at least one first groove, the first cathode blocker is provided between at least two adjacent columns of first pixels, to make the cathodes of the two adjacent columns of first pixels disconnected.

In an exemplary embodiment, on a plane parallel to the display substrate, an orthographic projection of an opening of the first groove away from a substrate of the display substrate is located within an orthographic projection of an opening of the first groove close to the substrate.

In an exemplary embodiment, the first cathode blocker includes a plurality of the first grooves and a plurality of cathode inhibitor layers; on a plane parallel to the display substrate, an orthographic projection of the first groove and an orthographic projection of the cathode inhibitor layer are alternately disposed in the same first cathode blocker.

In an exemplary embodiment, on the plane parallel to the display substrate, orthographic projections of the first grooves of the plurality of first cathode blockers are arranged along a first direction, and orthographic projections of the cathode inhibitor layers of the plurality of first cathode blockers are arranged along the first direction, the first direction is perpendicular to an extending direction of an orthographic projection of the first cathode blocker.

In an exemplary embodiment, the plane parallel to the display substrate, the orthographic projection of the first groove overlaps with an orthographic projection of an adjacent cathode inhibitor layer in the same first cathode blocker.

In an exemplary embodiment, on a cross-section perpendicular to the display substrate, the display substrate includes a driving structure layer and a light-emitting structure layer sequentially disposed on a substrate, wherein the driving structure layer includes a source-drain electrode layer disposed on the substrate, and the source-drain electrode layer includes a source electrode and a drain electrode disposed in the second display region; the light-emitting structure layer includes a first electrode layer, a pixel define layer, a light-emitting layer and a second electrode layer which are sequentially disposed, wherein the first electrode layer includes an anode of the passive light-emitting device and an anode of the active light-emitting device, the second electrode layer includes a cathode of the passive light-emitting device and a cathode of the active light-emitting device, the cathode inhibitor layer is disposed between the light-emitting layer and the second electrode layer, and the first groove is disposed on a side of the source-drain electrode layer away from the substrate.

In an exemplary embodiment, the first pixel includes a first color sub-pixel, a second color sub-pixel and a third color sub-pixel; the first color sub-pixel and the second color sub-pixel are disposed in the same row, and the third color sub-pixel is located a row adjacent to a row where the first color sub-pixel and the second color sub-pixel are located; and the row where the first color sub-pixel is located and the row where the third color sub-pixel is located are alternately arranged in the first display region.

In an exemplary embodiment, the cathode inhibitor layer is disposed between every two adjacent third color sub-pixels in the same row of the first display region.

In an exemplary embodiment, in the same row of the first display region, the first groove is disposed between the first color sub-pixel and the second color sub-pixel which are adjacent to located at different first pixels.

In an exemplary embodiment, a side of the first display region facing the second display region is provided with a second cathode blocker surrounding an edge of the first display region, to make the cathodes of the first display region and the cathodes of the second display region disconnected.

In an exemplary embodiment, the second cathode blocker includes a second groove, and on a plane parallel to the display substrate, an orthographic projection of the second groove surrounds an edge of a side of an orthographic projection of the first display region facing the second display region.

In an exemplary embodiment, the second groove and the first groove are disposed in the same layer.

In an exemplary embodiment, the first display region further includes a plurality of first driving signal lines and a plurality of second driving signal lines, and anodes of passive light-emitting devices in sub-pixels of the same color of the first pixels in the same row are electrically connected to one of the second driving signal lines; cathodes of the passive light-emitting devices of the first pixels in the same column are electrically connected to one of the first driving signal lines.

In an exemplary embodiment, a pixel distribution density of the first display region is smaller than a pixel distribution density of the second display region.

In another aspect, an embodiment of the present disclosure provides a display apparatus, which includes the display substrate described above.

In an exemplary embodiment, the display apparatus further includes: a first driving chip and a second driving chip, wherein the first driving chip is electrically connected to the passive light-emitting device and the second driving chip is electrically connected to the pixel drive circuit.

In an exemplary embodiment, the display apparatus further includes: a sensor device, wherein the sensor device is disposed in the first display region, and a photosensitive surface of the sensor device is consistent with a light-emergence side of the display substrate.

In yet another aspect, an embodiment of the present disclosure further provides a preparation method of a display substrate including a first display region and a second display region, the first display region includes a plurality of first pixels distributed in an array; the first pixel includes a passive light-emitting device, the second display region includes a plurality of second pixels, the second pixel includes an active light-emitting device and a pixel drive circuit electrically connected to the active light-emitting device; the preparation method includes: forming the pixel drive circuit in the second display region on a substrate; and on a side of the pixel drive circuit away from the substrate, forming a plurality of first cathode blockers in the first display region, and the first cathode blocker includes at least one first groove; wherein, the first cathode blocker is provided between at least two adjacent columns of first pixels, to make cathodes of the two adjacent columns of first pixels disconnected; and, forming the passive light-emitting device in the first display region and the active light-emitting device in the second display region, and the active light-emitting device is electrically connected to the pixel drive circuit.

In an exemplary embodiment, forming the pixel drive circuit in the second display region on a substrate includes:

sequentially forming an active layer, a gate electrode, a source electrode and a drain electrode in the second display region on the substrate;

forming a plurality of first cathode blockers in the first display region includes:

forming a first insulating layer on a side of the source electrode and the drain electrode away from the substrate;

forming a second insulating layer provided with a first via on a side of the first insulating layer away from the substrate, wherein the first via exposes the first insulating layer;

forming an anode of the active light-emitting device and an anode of the passive light-emitting device on a side of the second insulating layer away from the substrate;

forming a pixel define layer on a side of the anodes away from the substrate, the pixel define layer is provided with a second via and a pixel opening region, wherein the second via exposes the first via, and the pixel opening region exposes the anodes;

forming an anode protection layer provided with a third via on a side of the pixel define layer away from the substrate, wherein the third via exposes the first via and the second via;

etching the second insulating layer through dry etch to form the first groove;

removing the anode protection layer;

forming a light-emitting layer in the pixel opening region on a side of the pixel define layer away from the substrate; and forming a cathode inhibitor layer on a side of the light-emitting layer away from the substrate, wherein on a plane parallel to the display substrate, an orthographic projection of the first groove and an orthographic projection of the cathode inhibitor layer of the same first cathode blocker are alternately disposed.

In an exemplary embodiment, the method further includes: forming a second groove surrounding an edge of the first display region on a side of the first display region facing the second display region through the same patterning process, to make the cathodes of the first display region and the cathodes of the second display region disconnected, while the first groove being prepared.

Other aspects will become apparent upon reading and understanding accompanying drawings and the detailed description.

BRIEF DESCRIPTION OF DRAWINGS

Accompanying drawings are used to provide an understanding of solutions of embodiments of the present disclosure, constitute a part of the specification to explain technical solutions together with embodiments of the present disclosure, and do not constitute limitations on the technical solutions.

DETAILED DESCRIPTION

Figure 1:
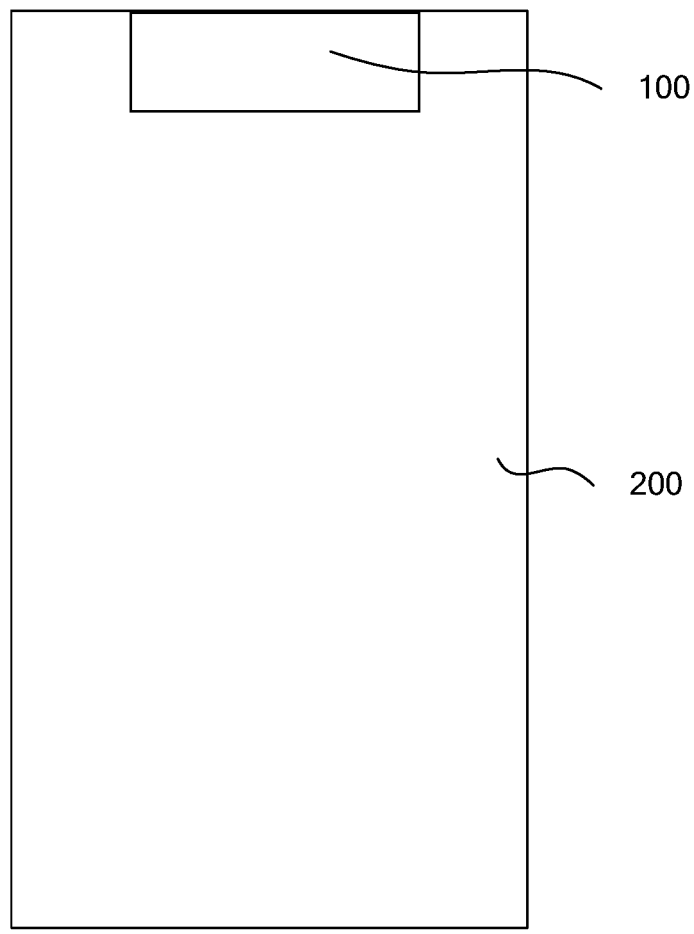
FIG. 1 is a schematic diagram of a display substrate according to an embodiment of the present disclosure.

Hereinafter embodiments of the present disclosure will be described in detail with reference to the accompanying drawings. The embodiments in the present disclosure and features in the embodiments can be combined with each other arbitrarily if there is no conflict.

In the drawings, magnitudes of various constituent elements and thicknesses and regions of layers are sometimes exaggerated for clarity. Therefore, implementations of the present disclosure are not necessarily limited to the sizes, and the shapes and magnitudes of the components in the drawings do not reflect true proportions. In addition, the drawings schematically show ideal examples, and implementations of the present disclosure are not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and a current can flow through the drain electrode, the channel region and the source electrode. In this specification, the channel region refers to a region which the current mainly flows through.

In this specification, it may be the case that a first electrode is a drain electrode and a second electrode is a source electrode, and it may also be the case that a first electrode is a source electrode and a second electrode is a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus further includes a case where the angle is above −85° and below 95°.

In this specification, "film" and "layer" may be interchangeable. For example, sometimes "conductive layer" may be replaced by "conductive film". Similarly, "insulating film" may sometimes be replaced by "insulating layer".

Figure 2:
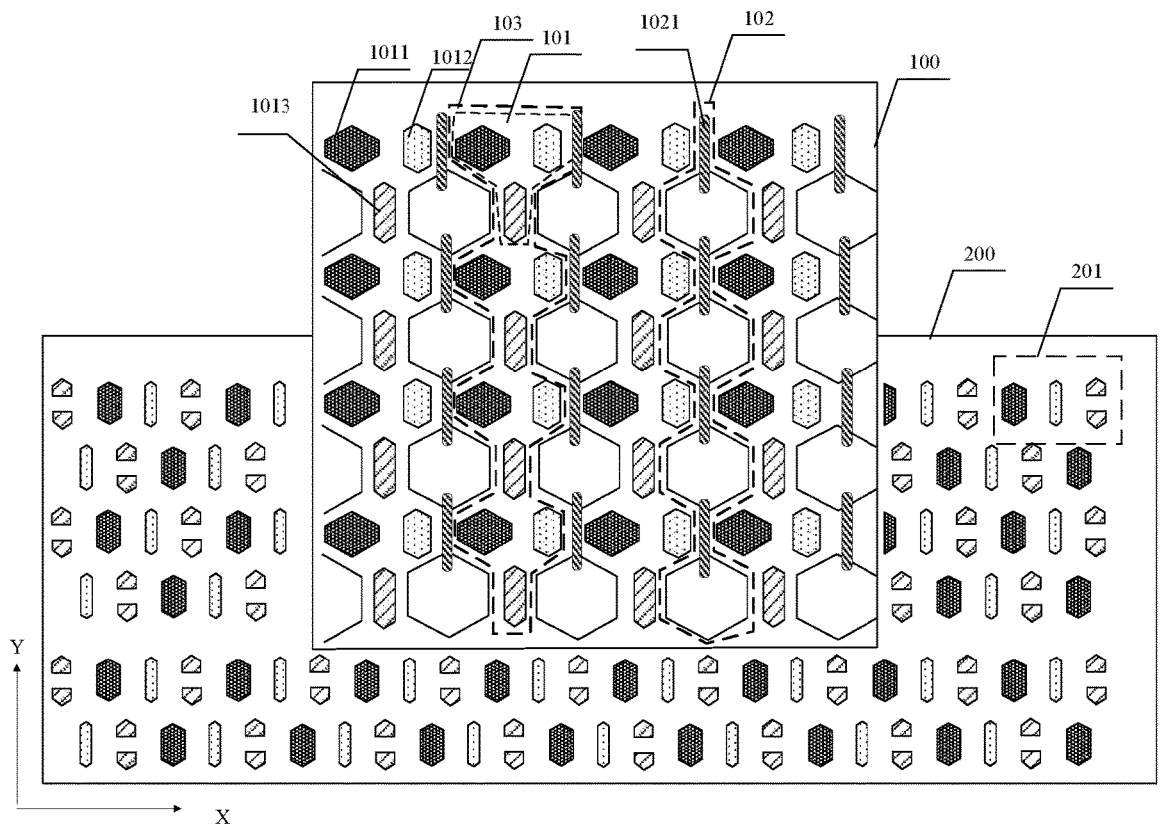
FIG. 2 is a schematic diagram of a layout of a display substrate according to an embodiment.

FIG. 1 and FIG. 2 are schematic diagrams of a display substrate according to embodiments of the present disclosure. A Region 100 in FIG. 2 is an enlarged view and only illustrates a part of the region 100 in FIG. 1, while a region 200 in FIG. 2 illustrates only a part of the region 200 in FIG. 1. As shown in FIG. 1 and FIG. 2, the display substrate may include a first display region 100 and a second display region 200. The first display region 100 includes a plurality of first pixels 101, the first pixel 101 includes a passive light-emitting device (not shown in FIG. 1 and FIG. 2), the second display region 200 includes a plurality of second pixels 201, the second pixel 201 includes an active light-emitting device and a pixel drive circuit electrically connected to the active light-emitting device (not shown in FIG. 1 and FIG. 2). The first display region 100 further includes a plurality of first cathode blockers 102, the first cathode blocker 102 includes at least one first groove 1021, wherein the first cathode blocker 102 is disposed between at least two adjacent columns of first pixels to disconnect cathodes of the two adjacent columns of first pixels.

Generally, when cathodes are prepared, an evaporation process is usually used to evaporate the cathodes on the entire surface of the substrate, which is not conducive to respectively driving the passive light-emitting devices in the first display region 100. In the embodiment of the present disclosure, the first cathode blocker 102 is disposed between the cathodes of at least two adjacent columns of first pixels, and the cathodes will not cover the first cathode blocker 102 when the cathodes are prepared, so that the cathodes are disconnected automatically at the first cathode blocker 102, thereby the cathodes of two adjacent columns of first pixels 101 are disconnected automatically, which is convenient for achieving respective drivings.

In an exemplary embodiment, the active light-emitting device includes a light-emitting device adopting an active driving light-emitting mode, and a pixel drive circuit is used for controlling light emission of the light-emitting device. The passive light-emitting device includes a light-emitting device adopting a passive driving light-emitting mode, and a driving signal is directly applied to the light-emitting device through a driving signal line without a pixel drive circuit.

According to the display substrate provided in the present embodiment, the passive light-emitting device is disposed in the first display region. Since the passive light-emitting device does not need to be provided with the pixel drive circuit, there is no pixel drive circuit or related metal wiring in the first display region, so that the light transmittance is high, and it is convenient to place front cameras, sensors (for example face recognition sensors, etc.), earphones and other elements, thereby achieving a full-screen design while increasing the screen-to-body ratio. In addition, a cathode blocker is disposed between at least two adjacent columns of first pixels, so that the first pixels in different columns may be driven respectively, thereby improving the screen-to-body ratio.

In an exemplary embodiment, materials of cathodes of the active light-emitting device and the passive light-emitting device may be the same, and may be formed by one evaporation process. Exemplarily, materials of the cathodes of active and passive light-emitting devices may be metal materials, such as magnesium (Mg), modified Mg, aluminum (Al), gold (Au), silver (Ag), which are not limited here. In an exemplary embodiment, a cation exchange membrane (CEM) cathode may be used to improve the transmittance of the first display region 100, which is convenient for disposing a sensor in the first display region 100.

In an exemplary embodiment, the passive light-emitting device is, for example, a passive matrix organic light-emitting diode (PMOLED), and the active light-emitting device is, for example, an active matrix organic light-emitting diode (AMOLED), but embodiments of the present disclosure are not limited to this.

In an exemplary embodiment, the first display region 100 may be disposed at an edge of a shorter side of the second display region 200, which is not limited to this in embodiments of the present disclosure. The first display region 100 may be disposed at other positions as required.

In an exemplary embodiment, a shape of the first display region 100 includes, for example, a rectangle, and a length of the first display region 100 along the X direction in FIG. 2 is longer, which is convenient for disposing a sensor or the like. The shape of the first display region 100 is only an example, and may be designed to be other shapes as required.

In an exemplary embodiment, a plurality of first display regions 100 may be provided in the display substrate.

In an exemplary embodiment, the first pixels 101 and the second pixels 201 are distributed in an array, for example. As shown in FIG. 2, the first display region 100 includes a plurality of first pixel columns 103, and the first cathode barriers 102 are disposed between adjacent first pixel columns 103, so that the cathodes of the first pixels 101 in different columns are independent of each other, which is convenient for driving each first pixel column 103 respectively. In another exemplary embodiment, the first cathode blockers 102 may be disposed between part of the adjacent first pixel columns 103, for example, one first cathode blocker 102 is disposed every two first pixel columns 103, and a plurality of first pixel columns 103 separated by the first cathode blockers 102 are driven respectively. For another example, the first display region 100 is divided into a plurality of sub-display regions, where each sub-display region includes one or more first pixel columns 103, and first cathode blockers 102 are disposed between the sub-display regions, and the sub-display regions are driven respectively. The number of the first pixel columns 103 included in the sub-display region may be the same or different. In an exemplary embodiment, each sub-display region may include one first pixel column 103.

In an exemplary embodiment, as shown in FIG. 2, the first pixel 101 may include a first color sub-pixel 1011, a second color sub-pixel 1012 and a third color sub-pixel 1013, each of which is provided with a passive light-emitting device. The passive light-emitting device in the first color sub-pixel 1011 is configured to emit light of a first color, the passive light-emitting device in the second color sub-pixel 1012 is configured to emit light of a second color, and the passive light-emitting device in the third color sub-pixel 1013 is configured to emit light of a third color. In some examples, the first color, the second color and the third color may be selected from red, green and blue. For example, the first color is blue, the second color is red, and the third color is green. Of course, embodiments of the present disclosure include but are not limited to this. The first color, the second color and the third color may also be other colors.

In an exemplary embodiment, a pixel drive circuit may include a storage capacitor, and a transistor electrically connected to the storage capacitor. For example, the pixel drive circuit may include at least one of a 2T1C pixel circuit, a 3T1C pixel circuit and a 7T1C pixel circuit.

In an exemplary embodiment, the first display region 100 may further include a plurality of first driving signal lines and a plurality of second driving signal lines, and anodes of the passive light-emitting devices in sub-pixels of the same color of the first pixels 101 in a same row may be electrically connected to one of the second driving signal lines. Cathodes of the passive light-emitting devices of the first pixels 101 in a same column may be electrically connected to one of the first driving signal lines.

Figure 3:
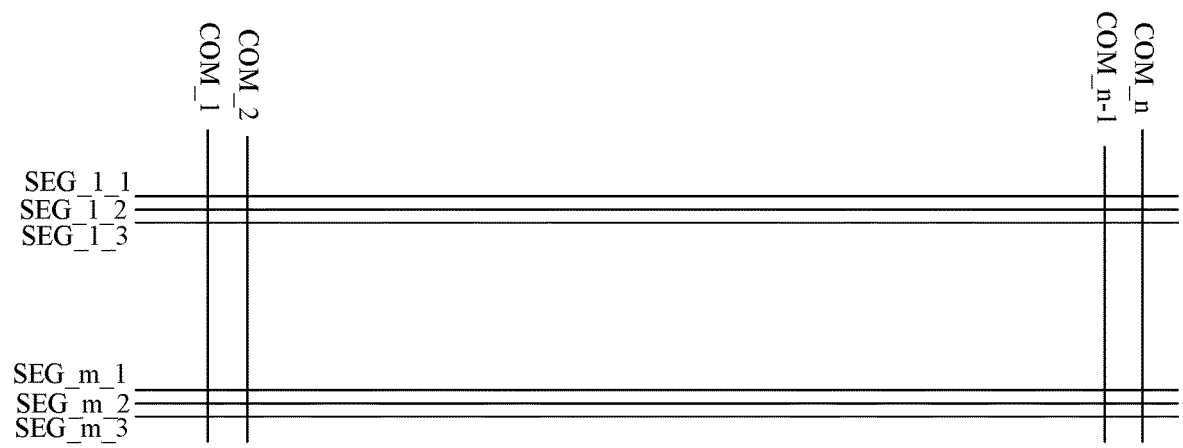
FIG. 3 is a schematic diagram of driving signal line according to an embodiment.

In an exemplary embodiment, as shown in FIG. 3, the first display region 100 includes n columns of first pixels 101 and m rows of first pixels 101. The first display region 100 includes a plurality of first driving signal lines COM_1 to COM_n, and the cathodes of the passive light-emitting devices of first pixels 101 in an i-th column are connected to an i-th first driving signal line COM_i, where i=1 to n. The first display region 100 includes a plurality of second driving signal lines SEG_j_1, SEG_j_2, and SEG_j_3, where j=1 to m. The first color sub-pixels 1011 of first pixels 101 in a j-th row are connected to the second driving signal line SEG_j_1, the second color sub-pixels 1012 of first pixels 101 in the j-th row are connected to the second driving signal line SEG_j_2, and the third color sub-pixels 1013 of first pixels 101 in the j-th row are connected to the second driving signal line SEG_j_3. In the present embodiment, the driving mode of the first display region 100 is as follows: the first pixel columns 103 are scanned column by column. When the i-th column is scanned, the i-th first driving signal line COM_i is set to a low level (for example, 0 volt (V), but is not limited here), and the remaining the first driving signal lines (n−1 driving signal lines except COM_i) are set to a high level (so that the first pixels 101 in the other columns except the i-th column do not emit light). The signals provided by the second driving signal lines SEG_j_1, SEG_j_2, SEG_j_3, where j=1 to m, control the brightness of a plurality of sub-pixels in the i-th column.

Figure 4:
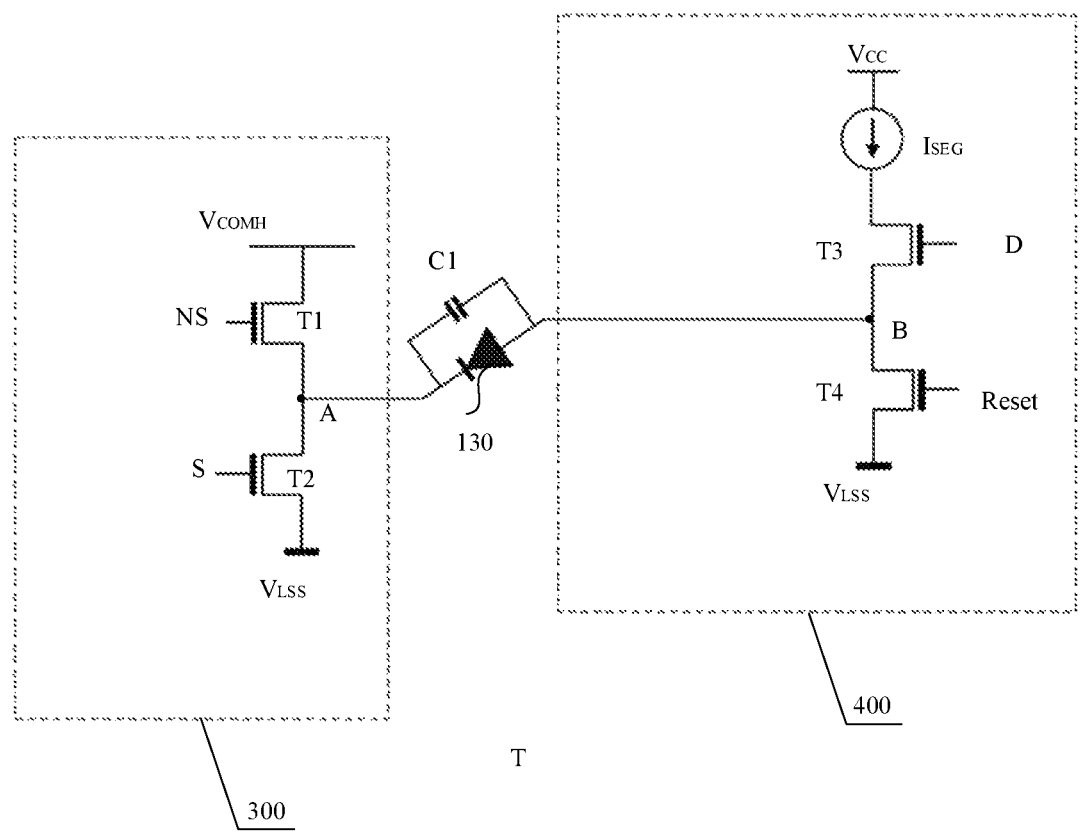
FIG. 4 is a schematic diagram of driving of a passive light-emitting device according to an embodiment.

FIG. 4 is a schematic diagram of circuit connection of a passive light-emitting device according to an exemplary embodiment. As shown in FIG. 4, in the present embodiment, a capacitor C1 is connected in parallel at two terminals of a passive light-emitting device 130. A cathode of the passive light-emitting device 130 is connected to an output terminal A of a first driver 300 through a first driving signal line, and an anode of the passive light-emitting device 130 is connected to an output terminal B of a second driver 400 through a second driving signal line. The first driver 300 may include a first transistor T1 and a second transistor T2. The first transistor T1 has a control electrode connected to a first control terminal NS, a first electrode connected to a first power supply terminal $V_{COMH}$, and a second electrode connected to a first electrode of the second transistor T2 and the output terminal A. The second transistor T2 has a first electrode connected to the second control terminal S, and a second electrode connected to the second power terminal $V_{LSS}$. When the first transistor T1 is turned on and the second transistor T2 is turned off, the first driver 300 outputs a voltage (a high level) of the first power supply terminal $V_{COMH}$ and the passive light-emitting device 130 does not emit light. When the first transistor T1 is turned off and the second transistor T2 is turned on, the first driver 300 outputs a voltage (a low level) of the second power supply terminal $V_{LSS}$ and the passive light-emitting device 130 emits light.

The second driver 400 includes a current source Isec, a third transistor T3 and a fourth transistor T4. The current source has one terminal connected to a third power supply terminal Vcc, and the other terminal connected to a first electrode of the third transistor T3. The third transistor T3 has a control electrode connected to a control terminal D, and a second electrode connected to an output terminal B. The fourth transistor T4 has a first electrode connected to the output terminal B, a second electrode connected to the second power supply terminal $V_{LSS}$, and a control electrode connected to a reset terminal Reset. When the third transistor T3 is turned on and the fourth transistor T4 is turned off, and the cathode of the passive light-emitting device 130 is connected to a low level, the passive light-emitting device 130 emits light, and the current of the current source Isec controls the brightness of the passive light-emitting device 130. When the third transistor T3 and the fourth transistor T4 are turned on, the passive light-emitting device 130 does not emit light.

Figure 5:
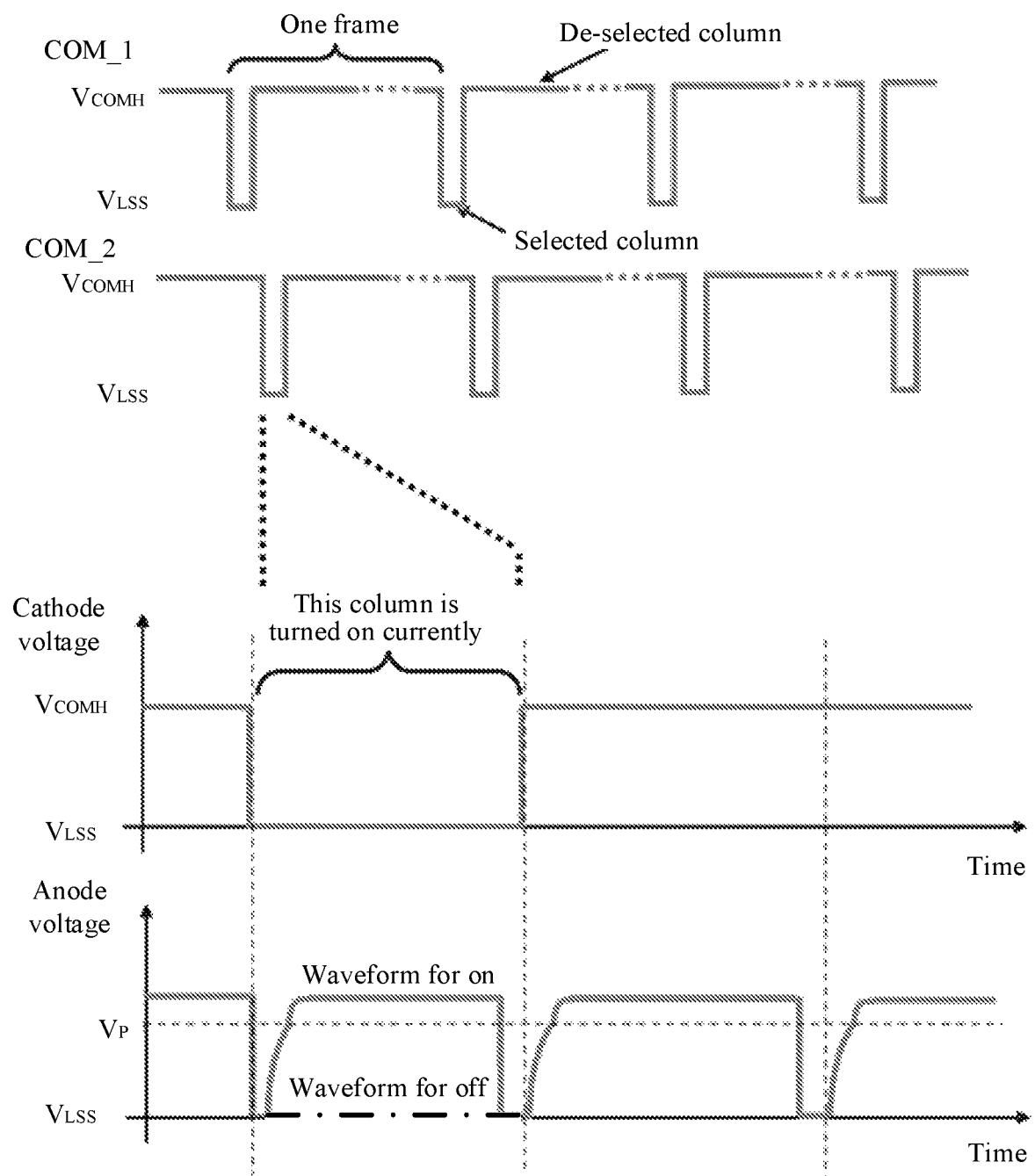
FIG. 5 is a schematic diagram of driving of a first display region according to an embodiment.

FIG. 5 is a schematic diagram of driving of a first display region according to an exemplary embodiment. As shown in FIG. 5, in one frame scanning time, low level signals are applied by the first driving signal lines COM_1 to COM_n sequentially (only COM_1 and COM_2 are illustrated in FIG. 5, while others are similar), so that the low level is applied to cathodes of the passive light-emitting devices of first pixels in a column connected to the first driving signal line, and a first column of first pixels 101 to a n-th column of first pixels 101 are sequentially turned on, and the second driving signal line applies the driving signal to the anodes of the passive light-emitting devices, so that the passive light-emitting devices emit light.

In an exemplary embodiment, on a plane parallel to the display substrate, an orthographic projection of an opening of the first groove 1021 away from the substrate may be located within an orthographic projection of an opening of the first groove 1021 close to the substrate. For example, the first groove 1021 is an undercut structure. With this structure of the first groove 1021, since the opening on a side away from the substrate is smaller than the opening on a side close to the substrate, the cathodes on two sides of the first groove 1021 will be effectively separated by the first groove 1021 when evaporating the cathodes. Compared with a solution that the first groove 1021 is replaced by an inverted trapezoidal pillar spacer, cathodes may be evaporated on a sidewall of the pillar spacer, which may cause the cathodes of two adjacent columns of first pixels 101 to be turned on. In the solution provided by the present embodiment, since the opening of the first groove 1021 on the side away from the substrate is smaller than the opening on the side close to the substrate (which causes the sidewall of the first groove to be depressed inward), it is difficult to evaporate the cathode on the sidewall of the first groove 1021, and the separation effect is better than that with a pillar spacer.

Figure 6:
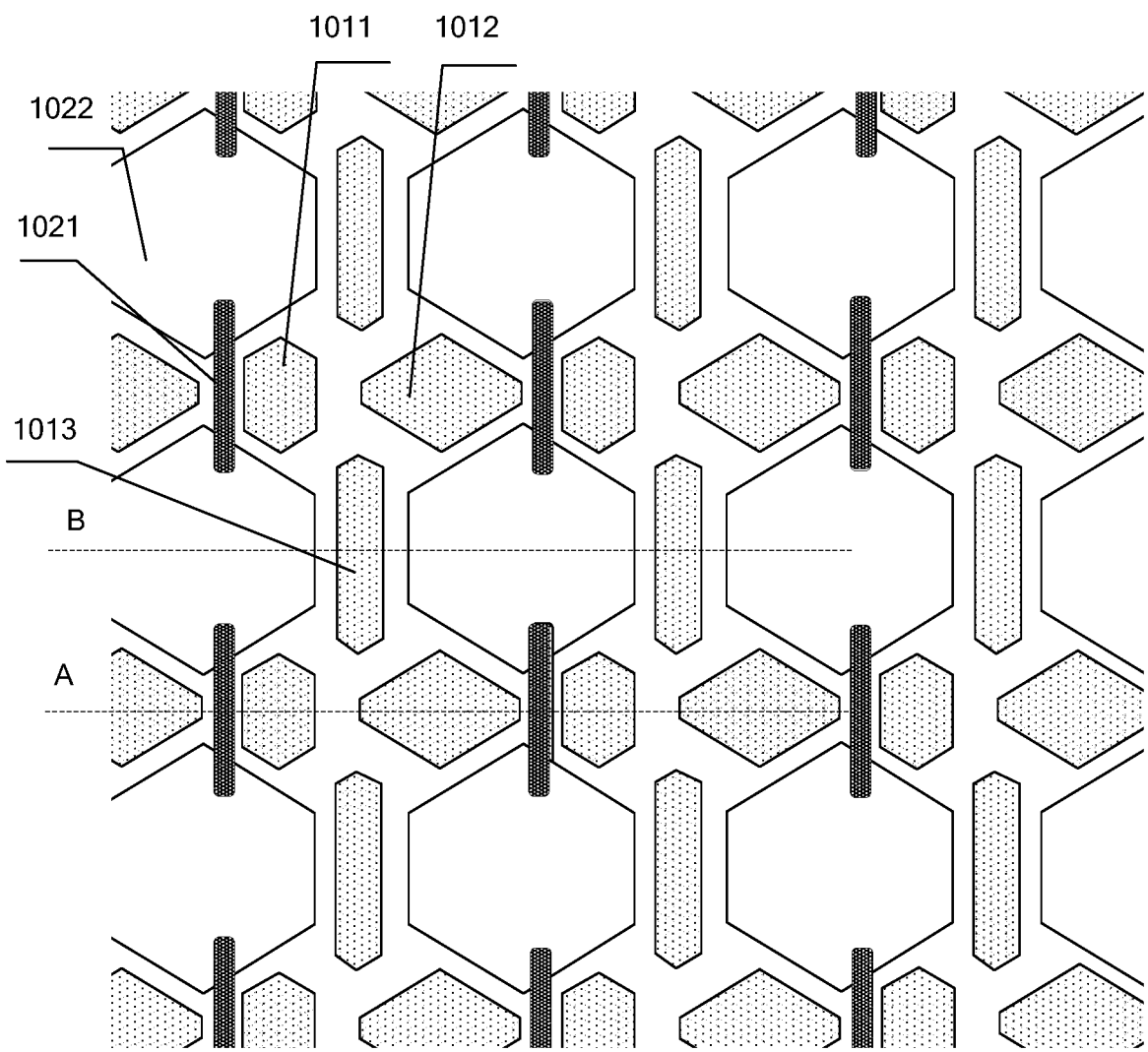
FIG. 6 is a schematic diagram of a first cathode blocker according to an embodiment.

FIG. 6 is a partial schematic diagram of a top view of a first display region 100. In an exemplary embodiment, as shown in FIG. 6, the first cathode blocker 102 may include a plurality of cathode inhibitor layers 1022. After forming the cathode inhibitor layers 1022, no cathode material is deposited on the cathode inhibitor layers 1022 when evaporating the cathode through the evaporation process, thereby the cathodes of two adjacent columns of first pixels 101 may be disconnected. In addition, since no cathode material is deposited on the cathode inhibitor layers 1022, light transmittance of a region where the cathode inhibitor layers 1022 is located is improved, thereby improving light transmittance of the first display region 100.

When the first cathode blocker 102 is not disposed, a mask may be used to evaporate the cathodes on the first display region 100. However, the metal material of the cathode will also be formed on the mask when the cathode is evaporated, causing a waste where the mask cannot be reused. According to the embodiment of the present disclosure, by providing the first cathode blocker, the cathode may be automatically disconnected at the first cathode blocker, thereby avoiding the waste of the mask and reducing the preparation cost.

In an exemplary embodiment, the pixels of the first display region 100 may be compressed to empty some regions where the cathode inhibitor layers 1022 are provided. A ratio of a region occupied by the first pixels 101 to a region occupied by the cathode inhibitor layers 1022 in the first display region 100 may be set as required, and the layout of the first pixels 101 and the cathode inhibitor layers 1022 may be also set as required.

In an exemplary embodiment, materials of the cathode inhibitor layers 1022 may include an organic material.

In an exemplary embodiment, a fine metal mask (FMM) may be used to form the cathode inhibitor layers 1022 on the substrate. The materials of the cathode inhibitor layers 1022 may also be formed on the FMM. However, when the materials of the cathode inhibitor layer 1022s are an organic material, the reuse of the FMM may not be affected, which reduces the cost.

In an exemplary embodiment, on a plane parallel to the display substrate, the cross-sectional shape of the cathode inhibitor layers 1022 includes, but is not limited to, at least one of the following: hexagon, rectangle and square.

In an exemplary embodiment, as shown in FIG. 6, the first cathode blocker 102 may include a plurality of the first grooves 1021 and a plurality of cathode inhibitor layers 1022; on a plane parallel to the display substrate, an orthographic projection of a first groove 1021 and an orthographic projection of a cathode inhibitor layer 1022 are alternately disposed in a same first cathode blocker. Here is only an example, and the first groove 1021 and the cathode inhibitor layer 1022 may be disposed in other ways.

In an exemplary embodiment, on a plane parallel to the display substrate, the orthographic projections of the first grooves 1021 of the plurality of first cathode barriers 102 are disposed along a first direction, and the orthographic projections of the cathode inhibitor layers 1022 of the plurality of first cathode barriers 102 are disposed along the first direction, the first direction is perpendicular to an extending direction of an orthographic projection of the first cathode barrier 102. As shown in FIG. 2, an extending direction of an orthographic projection of the first cathode barrier 102 is a Y direction, and the first direction is an X direction. The cathode inhibitor layers 1022 of different first cathode barriers 102 are distributed along the X direction, and the first grooves 1021 of different first cathode barriers 102 are distributed along the X direction, to form a row of first grooves 1021. The alternate arrangement of a row of cathode inhibitor layers 1022 makes the first grooves 1021 and cathode inhibitor layers evenly disposed.

In an exemplary embodiment, on a plane parallel to the display substrate, an orthographic projection of the first groove 1021 may overlap with an orthographic projection of an adjacent cathode inhibitor layers 1022 in the same first cathode blocker 102. As shown in FIG. 6, the orthographic projection of the first groove 1021 overlaps with orthographic projections of two adjacent cathode inhibitor layers 1022, and the cathode inhibitor layers 1022 overlap with orthographic projections of two adjacent first grooves 1021.

With this arrangement, in a column direction of first pixels 101, the cathodes of two adjacent columns of first pixels may be separated.

In an exemplary embodiment, a pixel distribution density of the first display region 100 is smaller than a pixel distribution density of the second display region 200. By configuring the pixel distribution density in the first display region 100 to be smaller than that in the second display region 200, the light transmittance of the first display region 100 may be improved. Herein, the pixel distribution density refers to the number of pixels uniformly disposed in a unit area. When the first display region 100 does not need to display an image, the first display region 100 may be made to reach a transparent effect to the maximum extent, and the front camera and sensor under the display panel can obtain light from the first display region 100 for imaging. When the first display region 100 needs to display an image, since the first display region 100 still has pixels, the image can be displayed.

In an exemplary embodiment, the pixel distribution density in the first display region 100 may be made approximately equal to the pixel distribution density in the second display region 200. In this way, the first display region 100 and the second display region 200 may have higher resolution when normally displaying images together.

In an exemplary embodiment, as shown in FIG. 2, in the first pixel 101, a light-emitting area of the first color sub-pixel 1011 may be larger than a light-emitting area of the third color sub-pixel 1013, and a light-emitting area of the third color sub-pixel 1013 may be larger than a light-emitting area of the second color sub-pixel 1012. For example, the first pixel 101 may be set according to the embodiment in which the light-emitting area of the blue sub-pixel is larger than the light-emitting area of the green sub-pixel and the light-emitting area of the green sub-pixel is larger than the light-emitting area of the red sub-pixel. The design may be determined according to the requirements of practical application, which is not limited here.

In an exemplary embodiment, as shown in FIG. 2, in the same first pixel 101, the first color sub-pixel 1011 and the second color sub-pixel 1012 may be disposed in the same row, and the third color sub-pixel 1013 is located in a row adjacent to the row where the first color sub-pixel 1011 and the second color sub-pixel 1012 are located. For example, in the same first pixel 101, the light-emitting region of the first color sub-pixel 1011 and the light-emitting region of the second color sub-pixel 1012 may be disposed in the same row, and the light-emitting region of the third color sub-pixel 1013 is located in a row adjacent to the row where the light-emitting region of the first color sub-pixel 1011 and the light-emitting region of the second color sub-pixel 1012 are located. For example, in the same first pixel 101, the light-emitting region of the first color sub-pixel 1011 and the light-emitting region of the second color sub-pixel 1012 may be provided in a first row, and the light-emitting region of the third color sub-pixel 1013 may be provided in the second row. In this way, the central connecting lines of the light-emitting regions of the first color sub-pixel 1011, the second color sub-pixel 1012 and the third color sub-pixel 1013 in the same first pixel 101 may form a triangle. In this way, horizontal dark and bright stripes may be avoided in the first display region 100. In the present disclosure, a row composed of pixels is different from a row composed of sub-pixels, and a pixel row may include two sub-pixel rows, depending on the arrangement of sub-pixels. For example, when sub-pixels included in a pixel are disposed in the same row, the pixel row is the same as the sub-pixel row, and when sub-pixels included in a pixel are disposed in different rows, a pixel row includes a plurality of sub-pixel rows.

In an exemplary embodiment, as shown in FIG. 2, in the first display region 100, the arrangement structure of sub-pixels in each first pixel 101 may be the same, and the sub-pixels in the first display region 100 are uniformly arranged, so that the cathode inhibitor layers 1022 and the first grooves 1021 are uniformly disposed accordingly.

In an exemplary embodiment, as shown in FIG. 2, in the first display region 100, the row where the first color sub-pixel 1011 is located and the row where the third color sub-pixel 1013 is located may be alternately disposed along the column direction Y.

In an exemplary embodiment, as shown in FIG. 6, the cathode inhibitor layer 1022 may be disposed between two adjacent third color sub-pixels 1013, and the cathodes of two adjacent third color sub-pixels 1013 are separated by the cathode inhibitor layer 1022.

In an exemplary embodiment, as shown in FIG. 6, in the same row, the first groove 1021 is disposed between the first color sub-pixel 1011 and the second color sub-pixel 1012 which are adjacent to each other and located in different first pixels 101, and the cathodes of the adjacent first color sub-pixels 1011 and the second color sub-pixel 1012 are separated by the first groove 1021.

Figure 7:
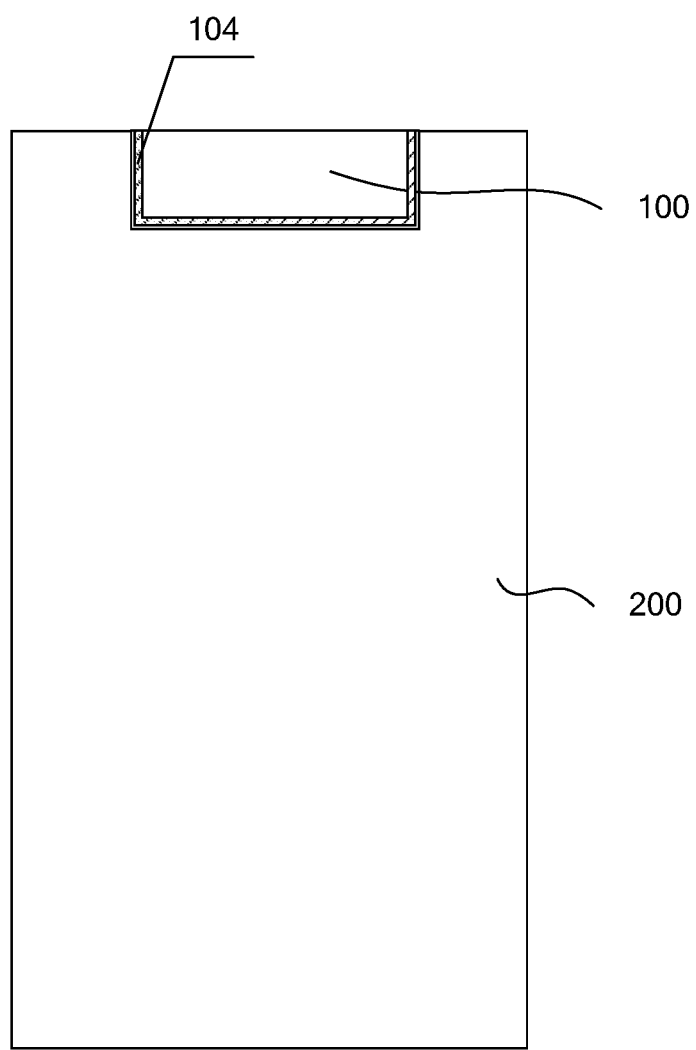
FIG. 7 is a schematic diagram of a second cathode blocker according to an embodiment.

In an exemplary embodiment, a size of the third color sub-pixel 1013 may be smaller than that of the first color sub-pixel 1011 and that of the second color sub-pixel 1012. The third color sub-pixel 1013 occupies a smaller size, to make size of the cathode inhibitor layer 1022, which is disposed between two adjacent third color sub-pixels 1013, larger and increase the transmittance. The first color sub-pixel 1011 and the second color sub-pixel 1012 are relatively large in size and close to each other, and the first groove 1021 may be provided between the first color sub-pixel 1011 and the second color sub-pixel 1012 which are adjacent to each other located in different first pixels 101 to ensure sufficient isolation. In an exemplary embodiment, as shown in FIG. 7, a second cathode blocker 104 surrounding an edge of a side of the first display region 100 facing the second display region 200 is disposed, so that the cathodes of the first display region 100 and the second display region 200 are disconnected, and it is convenient to independently control the first display region 100 and the second display region 200 to display, that is, the second cathode blocker 104 is disposed at a junction of the first display region 100 and the first display area 200 and surrounds the first display region 100. A whole surface evaporation method may be adopted when preparing the cathodes, so that the cathodes of the second display region 200 is a whole. Therefore, the cathodes of the first display region 100 and those of the second display region 200 are separated, and mutual conduction between the cathodes of the first display region 100 and the second display region 200 is avoided. The second cathode blocker 104 may be implemented in various forms, such as a cathode inhibitor layer, a groove, and a cathode inhibitor layer and a groove.

In an exemplary embodiment, the second cathode blocker 104 includes a second groove, and on a plane parallel to the display substrate, an orthographic projection of the second groove surrounds an edge of a side of an orthographic projection of the first display region 100 facing the second display region 200. That is, the second cathode blocker 104 is fully composed of grooves.

In an exemplary embodiment, on a plane parallel to the display substrate, an orthographic projection of an opening of the second groove away from the substrate may be located within an orthographic projection of an opening of the second groove close to of the substrate.

In an exemplary embodiment, the second groove and the first groove 1021 may be disposed on the same layer, that is, the second groove and the first groove 1021 are formed by the same preparation process. However, the embodiment of the present disclosure is not limited to this.

Figure 8:
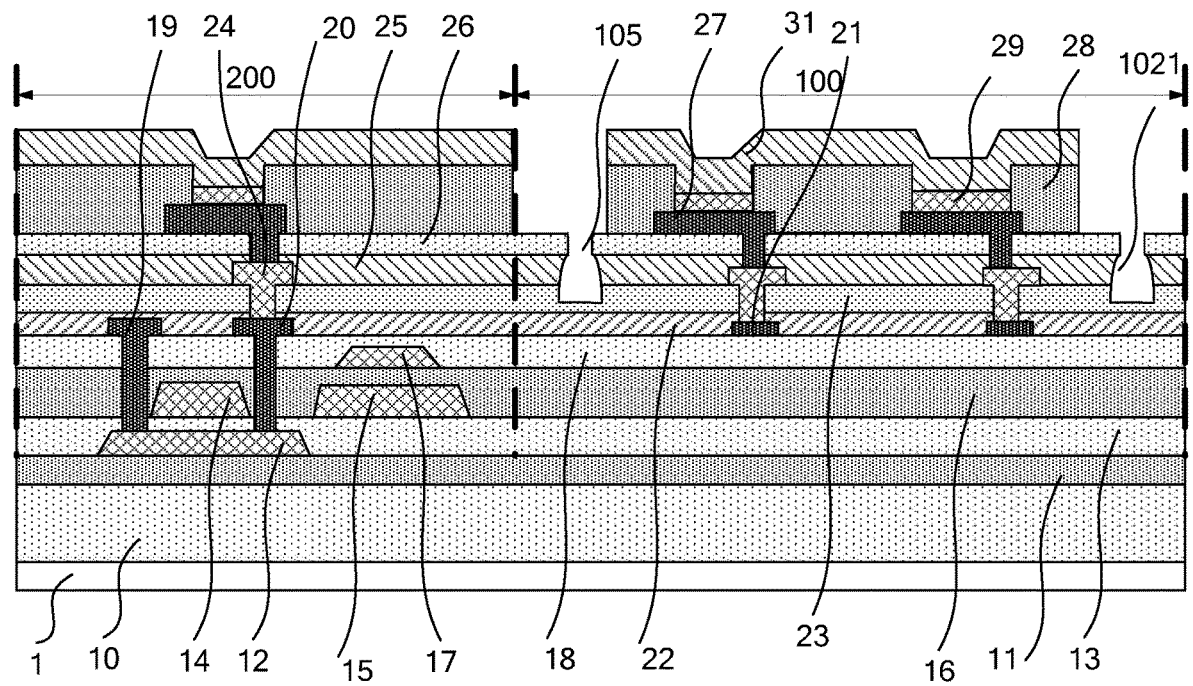
FIG. 8 is a cross-sectional diagram of a display substrate according to an embodiment.
Figure 9:
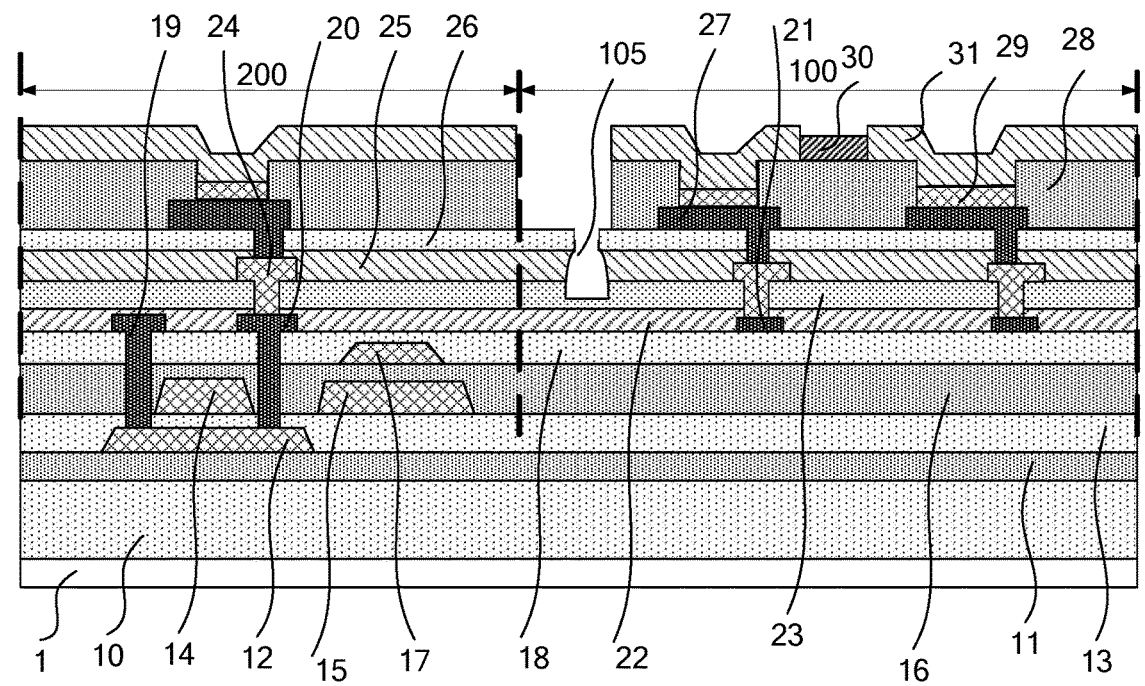
FIG. 9 is a cross-sectional diagram of a display substrate according to another embodiment.

FIG. 8 is a partial schematic diagram of a cross-sectional view of the display substrate shown in FIG. 6 along a direction A. FIG. 9 is a partial schematic diagram of a cross-sectional view of the display substrate shown in FIG. 6 along a direction B. As shown in FIG. 8 and FIG. 9, on a plane perpendicular to the display substrate, the display substrate includes a driving structure layer and a light-emitting structure layer sequentially disposed on a substrate 10, and in the second display region 200, the driving structure layer includes a third insulating layer 11, an active layer 12, a fourth insulating layer 13, a gate electrode 14, a first capacitor electrode 15, a fifth insulating layer 16, a second capacitor electrode 17, a sixth insulating layer 18, a source electrode 19 and a drain electrode 20, which are disposed in sequence. In the first display region 100, the driving structure layer may include a second driving signal line 21 disposed in the same layer as the source electrode 19 and the drain electrode 20. In the first display region 100 and the second display region 200, the driving structure layer further includes a seventh insulating layer 22 and an eighth insulating layer 23 which are sequentially disposed on a side of the source electrode 19 and the drain electrode 20 away from the substrate 10; and, a connection electrode 24 disposed on a side of the eighth insulating layer 23 away from the substrate, and a first insulating layer 25 and a second insulating layer 26 sequentially disposed on a side of the connection electrode 24 away from the substrate. The first groove 1021 and the second groove 105 are disposed on a side of the source electrode 19 and the drain electrode 20 away from the substrate. In a direction perpendicular to the display substrate, the depths of the first groove 1021 and the second groove 105 may be set to be smaller than a total thickness of the first insulating layer 25 and the second insulating layer 26, that is, the second insulating layer 26 is etched through, but the first insulating layer 25 is not etched through. Alternatively, the depths of the first groove 1021 and the second groove 105 may be set to be smaller than a total thickness of the eighth insulating layer 23, the first insulating layer 25 and the second insulating layer 26, that is, the first groove 1021 and the second groove 105 etch through the first insulating layer 25 and the second insulating layer 26, but do not etch through the eighth insulating layer 23. The depths of the grooves may be set as required. The light-emitting structure layer includes a first electrode layer, a pixel define layer 28, a light-emitting layer 29, a cathode inhibitor layer 30 and a second electrode layer which are sequentially disposed on a side of the second insulating layer 26 away from the substrate. The first electrode layer includes an anode 27 of the passive light-emitting device and an anode 27 of the active light-emitting device, the second electrode layer includes a cathode 31 of the passive light-emitting device and a cathode 31 of the active light-emitting device.

In the present embodiment, the second driving signal line 21 is disposed in the same layer as the source electrode 19 and the drain electrode 20. In another embodiment, the second driving signal line 21 may be disposed in the same layer as the gate electrode 14. Alternatively, the second driving signal line 21 and the second capacitor electrode 17 may be provided in the same layer. The design may be determined according to the requirements of practical application, which is not limited here.

A structure of a display substrate according to the present embodiments is described below with a preparation process of a display substrate. Wherein, the "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured by deposition or coating of a certain material on a substrate. If the "thin film" does not need a patterning process during the whole manufacturing process, the "thin film" may also be referred to as a "layer". When the "thin film" needs to be subjected to a patterning process during the whole manufacturing process, a "thin film" is referred to as a "thin film" prior to the patterning process and as a "layer" subsequent to the patterning process. The "layer" subsequent to the patterning process contains at least one "pattern". In the present disclosure, "A and B are disposed on the same layer" means that A and B are formed at the same time by the same patterning process.

The preparation process may include the following operations.

(1) A flexible material is coated on a glass carrier plate 1, and is cured to form a film to form a substrate 10. In the present embodiment, the substrate 10 may be a flexible substrate. The flexible material may be polyimide (PI), polyethylene terephthalate (PET) or a surface-treated polymer soft film or the like. In an exemplary implementation, the substrate 10 may have a single-layer structure or a laminated multi-layer structure. The substrate of the laminated structure may include flexible material/inorganic material/flexible material, flexible material/inorganic material/amorphous silicon/flexible material/inorganic material, etc. The inorganic material may be a barrier thin film (Barrier), such as silicon nitride (SiNx) or silicon oxide (SiOx), which is used to improve the water and oxygen resistance of the substrate. Taking a PI/Barrier/PI/Barrier laminated structure as an example, the preparation process may include: coating a layer of polyimide on a glass carrier plate, depositing a layer of the barrier thin film after the layer of polyimide is cured to be a film, then coating a layer of polyimide on the barrier thin film, depositing a layer of the barrier thin film after the layer of polyimide is cured to be a film, thus forming a flexible substrate with a laminated structure.

(2) Patterns of active layers, gate electrodes, source electrodes and drain electrodes are prepared on the substrate 10.

A third insulating thin film and an active layer thin are sequentially deposited on the substrate 10, and the active layer thin film is patterned through a patterning process to form a third insulating layer 11 covering the entire substrate 10 and a pattern of active layers 12 disposed on the third insulating layer 11. The active layers 12 are formed in the second display region 200. After this patterning process, the first display region 100 includes the first insulating layer 11 disposed on the substrate 10.

A fourth insulating thin film and a first metal thin film are sequentially deposited, and the first metal thin film is patterned through a patterning process to form a fourth insulating layer 13 covering the entire substrate 10 and a pattern of a first gate metal layer disposed on the fourth insulating layer 13. The pattern of the first gate metal layer is formed in the display substrate region 200 and at least includes a gate electrode 14, a first capacitor electrode 15, a first gate line (not shown) and a second gate line (not shown). After this patterning process, the first display region 100 includes a third insulating layer 11 and the fourth insulating layer 13 stacked on the substrate 10.

A fifth insulating thin film and a second metal thin film are sequentially deposited, and the second metal thin film is patterned through a patterning process to form a fifth insulating layer 16 covering the entire substrate 10 and a pattern of a second gate metal layer disposed on the fifth insulating layer 16. The pattern of the second gate metal layer is formed in the second display region 200 and at least includes a second capacitor electrode 17, and a position of the second capacitor electrode 17 corresponds to a position of a first capacitor electrode 15. After this patterning process, the first display region 100 includes the third insulating layer 11, the fourth insulating layer 13 and the fifth insulating layer 16 stacked on the substrate 10.

A sixth insulating thin film is deposited and patterned through a patterning process to form a pattern of a sixth insulating layer 18 covering the entire substrate 10, the sixth insulating layer 18 is provided with two fourth vias. The two fourth vias are formed in the second display region 200 at positions corresponding to positions of two ends of the active layer 12. The sixth insulating layer 18, the fifth insulating layer 16 and the fourth insulating layer 13 in the fourth vias are etched away to expose a surface of the active layer 12. After this patterning process, the first display region 100 includes the third insulating layer 11, the fourth insulating layer 13, the fifth insulating layer 16, and the sixth insulating layer 18 that are sequentially disposed on the substrate 10.

Figure 10:
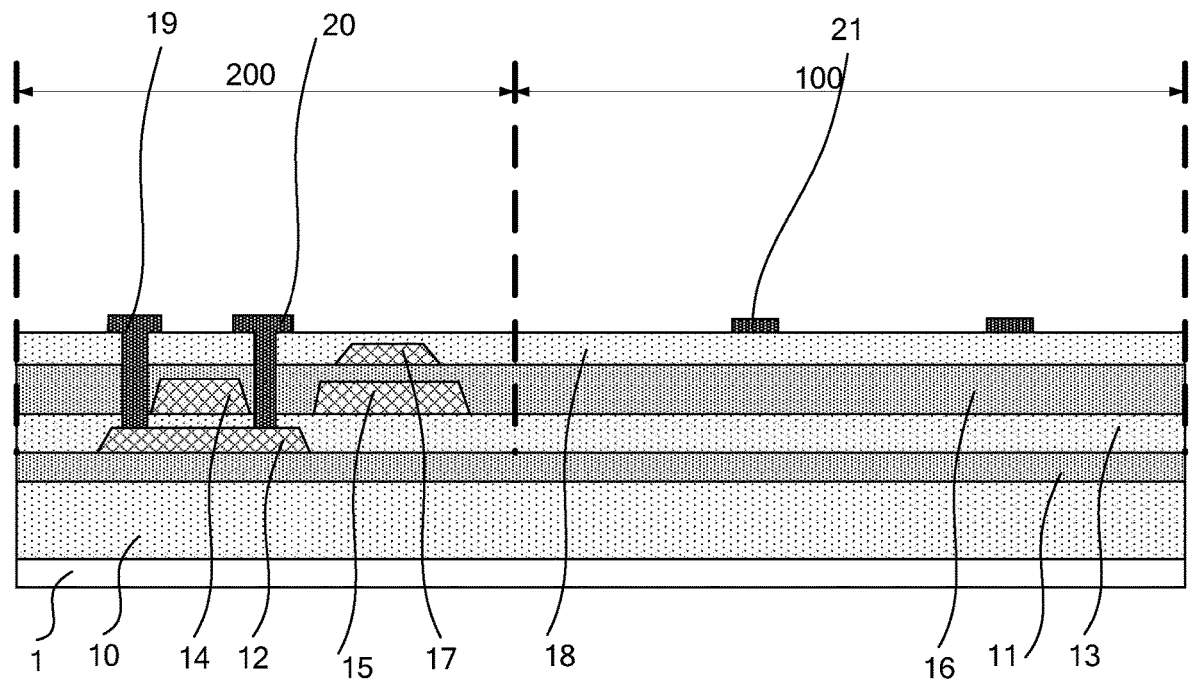
FIG. 10 is a schematic diagram after forming a driving structure layer according to an embodiment.

A third metal thin film is deposited and patterned through a patterning process, and a first source-drain metal layer (SD1) is formed on the sixth insulating layer 18, the first source-drain metal layer is formed in the second display region 200 and the first display region 100, and at least includes a source electrode 19, a drain electrode 20, a data line (not shown) and a power supply line (not shown), a second driving signal line 21, etc. The source electrode 19 and the drain electrode 20 are respectively connected to the active layer 12 through the fourth vias. After this patterning process, the first display region 100 includes the third insulating layer 11, the fourth insulating layer 13, the fifth insulating layer 16, the sixth insulating layer 18, and the second driving signal line 21 sequentially disposed on the substrate 10. As shown in FIG. 10, the active layer 12, the gate electrode 14, the source electrode 19 and the drain electrode 20 constitute a thin film transistor, and the first capacitor electrode 15 and the second capacitor electrode 17 constitute a storage capacitor.

In the present embodiment, the third insulating thin film, the fourth insulating thin film, the fifth insulating thin film, and the sixth insulating thin film may be made of at least one of silicon oxide (SiOx), silicon nitride (SiNx), and silicon oxynitride (SiON), and may be a single-layer structure or a multi-layer composite structure. Usually, the third insulating layer 11 is referred to as a buffer layer, which is used to improve the water and oxygen resistance capability of the substrate 10. The fourth insulating layer 13 and the fifth insulating layer 16 is referred to as gate insulating (GI) layers. The sixth insulating layer 18 may is referred to as an interlayer insulating (ILD) layer. The first metal thin film, the second metal thin film, the third metal thin film and the subsequent fourth metal thin film may adopt metal materials, such as silver (Ag), copper (Cu), aluminum (Al) and molybdenum (Mo), or alloy materials of the above metals, such as AlNd alloy or MoNb alloy etc., which may have a single-layer structure or a multi-layer composite structure, such as Mo/Cu/Mo. The active layer thin film may be made of amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, etc.

(3) A seventh insulating layer thin film is coated on the substrate on which the aforementioned patterns are formed, and a seventh insulating layer 22 covering the entire substrate 10 is formed through masking, exposure, and developing processes. The seventh insulating layer 22 is provided with a plurality of fifth vias and sixth vias. The fifth via exposes the drain electrode 20, and the sixth via exposes the second driving signal line 21. The seventh insulating layer 22 is referred to as a first passivation layer. The seventh insulating thin film may be made of at least one of silicon oxide, silicon nitride, and silicon oxynitride, and may be a single-layer structure or a multi-layer composite structure.

An eighth insulating layer thin film is coated on the substrate on which the aforementioned patterns are formed, an eighth insulating layer 23 covering the entire substrate 10 is formed through masking, exposure, and development processes. A seventh via and an eighth via are provided on the eighth insulating layer 23 at positions corresponding to the fifth via and the sixth via. The seventh via exposes the drain electrode 20, and the eighth via exposes the second driving signal line 21. The eighth insulating layer 23 is referred to as the first planarization layer. In an exemplary embodiment, the eighth insulating layer may be made of an organic material.

Figure 11:
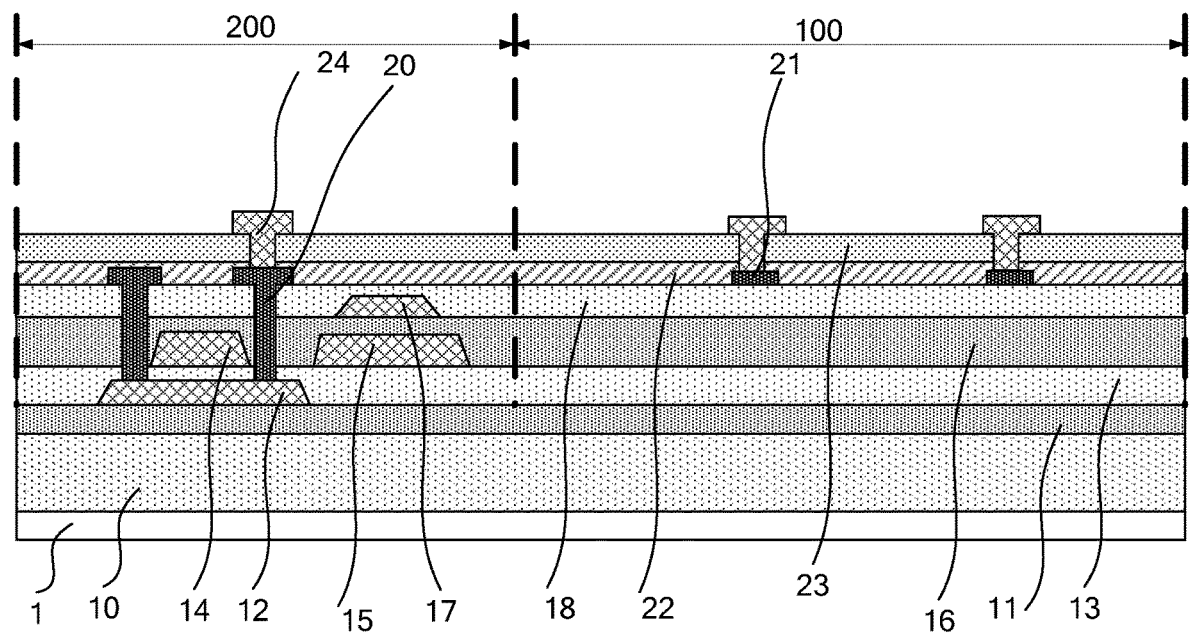
FIG. 11 is a schematic diagram after forming a pattern of connection electrodes according to an embodiment.

A fourth metal thin film is deposited and patterned through a patterning process to form a second source-drain metal layer (SD2) on the eighth insulating layer 23, the second source-drain metal layer is formed in the second display region 200 and the first display region 100 and includes a plurality of connection electrodes 24. The drain electrode 20 is connected to the connection electrodes 24 of the second display region 200, and the second driving signal line 21 is connected to the connection electrodes 24 of the first display region 100, as shown in FIG. 11.

(5) A first insulating layer thin film is coated on the substrate on which the aforementioned patterns are formed, and a first insulating layer 25 covering the entire substrate 10 is formed through masking, exposure, and development processes. A ninth via and a tenth via are provided on the first insulating layer 25 at positions corresponding to the seventh via and the eighth via. The ninth via exposes the connection electrode 24 connected to the drain electrode 20, and the tenth via exposes the connection electrode 24 connected to the second driving signal line 21. The first insulating layer 25 is referred to as a second planarization layer. In an exemplary embodiment, the first insulating thin film may be made of an organic material.

A second insulating layer thin film is coated on the substrate on which the aforementioned patterns are formed, and a second insulating layer 26 covering the entire substrate 10 is formed through masking, exposure and development processes. The second insulating layer 26 is provided with an eleventh via and a twelfth via at positions corresponding to the ninth via and the tenth via, and is also provided with a plurality of first vias (corresponding to the positions of the first groove 1021 and the second groove 105). The eleventh via exposes the connection electrode 24 connected to the drain electrode 20, the twelfth via exposes the connection electrode 24 connected to the second driving signal line 21, and the first vias exposes the first insulating layer 25. On a plane perpendicular to the display substrate, a cross-section of the first vias in a direction parallel to the substrate may have a length greater than 3 microns (μm), for example, 5 to 7 μm. The second insulating layer 26 is referred to as a second passivation layer. The second insulating thin film may be made of at least one of silicon oxide, silicon nitride, and silicon oxynitride, and may be a single-layer structure or a multi-layer composite structure.

Figure 12:
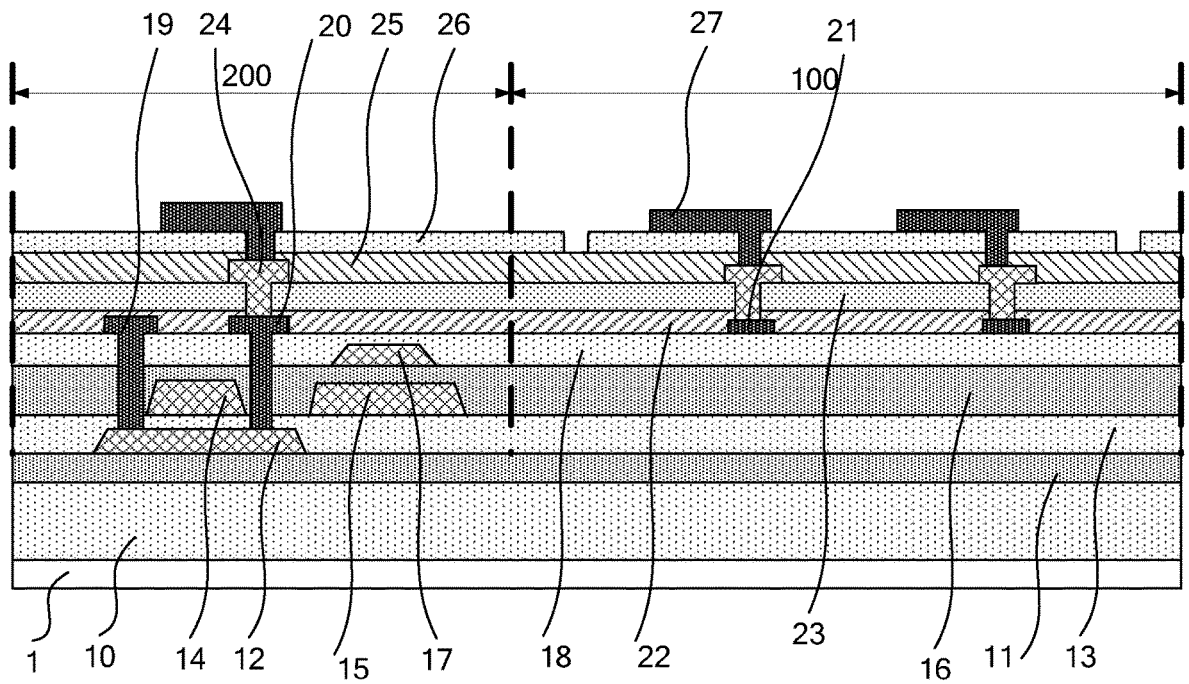
FIG. 12 is a schematic diagram after forming a pattern of anodes according to an embodiment.

A transparent conductive thin film is deposited on the substrate on which the aforementioned patterns are formed, the transparent conductive thin film is patterned through a patterning process, and a pattern of anodes 27 is formed on the second insulating layer 26. The anode 27 is formed in the first display region 100 and the second display region 200. In the second display region 200, the anode 27 is connected to the connection electrode through the eleventh via provided in the second insulating layer 26, and is connected to the drain electrode 20 through the connection electrode. In the first display region 100, the anode 27 is connected to the connection electrode through the twelfth via provided on the second insulating layer 26, and is connected to the second driving signal line 21 through the connection electrode, as shown in FIG. 12. In an exemplary embodiment, the transparent conductive thin film may be made of indium tin oxide (ITO) or indium zinc oxide (IZO).

(6) A pixel define thin film is coated on the substrate on which the aforementioned patterns are formed, and a pattern of a pixel define layer (PDL) 28 is formed through masking, exposure and development processes. The pixel define layer 28 is provided with a pixel opening and a second via, and the second via corresponds to the position of the first via. On a plane parallel to the substrate, an orthographic projection of the first via is located within an orthographic projection of the second via, that is, the second via is slightly larger than the first via. The pixel define film in the pixel opening is developed away, to expose a surface of the anode 27.

Figure 13:
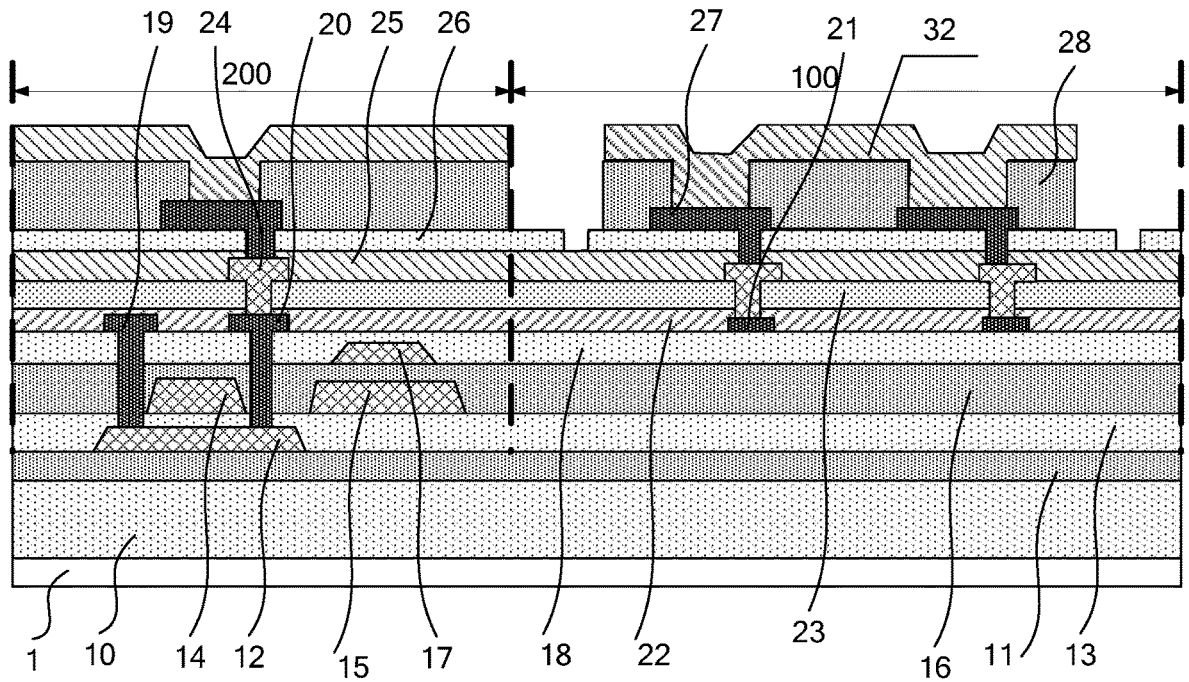
FIG. 13 is a schematic diagram after forming a pattern of an anode protection layer according to an embodiment.

An anodic protection thin film is deposited on the substrate on which the aforementioned patterns are formed, and a pattern of an anodic protection layer 32 is formed through masking, exposure and development processes. The pattern of anodic protection layer 32 is provided with a third via, and the third via corresponds to the second via. On a plane parallel to the substrate, an orthographic projection of the first via is located within an orthographic projection of the third via, that is, the third via is slightly larger than the first via, as shown in FIG. 13.

In an exemplary embodiment, the pixel define thin film may be polyimide, acrylic or polyethylene terephthalate, and the anode protection thin film may include Indium Gallium Zinc Oxide (IGZO).

(7) The second insulating layer 26 is used as a shield layer, the first insulating layer 25 is over-etched through dry etch to form a first groove 1021 and a second groove 105. In an exemplary embodiment, the etching rates of the dry etching gas on the first insulating layer 25 and the second insulating layer 26 are different, and the etching rate on the second insulating layer 26 is higher than that on the first insulating layer 25, so that an undercut structure may be formed, that is, the first groove 1021 and the second groove 105 are undercut structures. The embodiment of the present disclosure is not limited to this, and the first groove 1021 and the second groove 105 may be not the undercut structure. For example, on a plane perpendicular to the substrate 10, the first groove 1021 and the second groove 105 may have trapezoidal cross-sections, and a length of a side of the trapezoid away from the substrate 10 is shorter than the length of a side of the trapezoid close to the substrate 10. Alternatively, on a plane perpendicular to the substrate 10, the first groove 1021 and the second groove 105 may have quadrangular cross-sections, and the two opposite sides may be arcs.

In an exemplary embodiment, on a plane perpendicular to the substrate 10, the cross-sections of the first groove 1021 and the second groove 105 in the direction perpendicular to the substrate 10 may have a depth greater than 0.5 μm. In the present embodiment, the depths of the first groove 1021 and the second groove 105 in the direction perpendicular to the substrate 10 is greater than the total thickness of the first insulating layer 25 and the second insulating layer 26, that is, a part of the eighth insulating layer 26 is etched away during dry etching. However, the embodiment of the present disclosure is not limited to this, and the depth of the first groove 1021 and the second groove 105 may be set as required.

On a plane parallel to the substrate 10, an orthographic projection of the openings of the first and second grooves 1021 and 105 away from the substrate 10 is located within an orthographic projection of the openings of the first groove 1021 and the second groove 105 close to the substrate 10. That is, the openings of the first and second grooves 1021 and 105 away from the substrate 10 are small, while the openings of them close to the substrate 10 are large. This structure may effectively blocker the cathodes.

Figure 14:
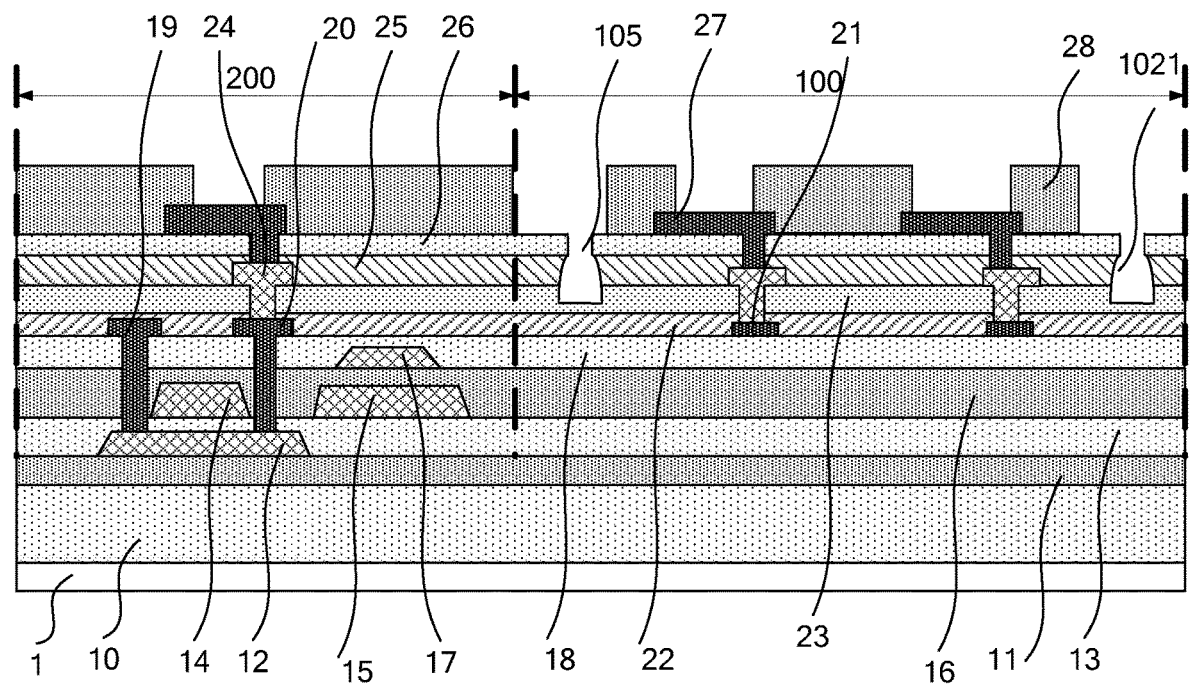
FIG. 14 is a schematic diagram after forming a pattern of a pixel define layer according to an embodiment.

The anode protection layer 32 is removed to complete the preparation of the first groove 1021 and the second groove 105, as shown in FIG. 14. In an exemplary embodiment, the anode protection layer 32 may be removed by wet etching.

(8) A pattern of cathode inhibitor layers is formed. A cathode inhibitor thin film is evaporated on the substrate on which the aforementioned patterns are formed, and patterned to form the pattern of cathode inhibitor layers 30 in the first display region 100. The cathode inhibitor thin film may be an organic material on which the cathode material cannot be deposited.

(9) Patterns of organic light-emitting layers and cathodes are formed.

Forming of patterns of the organic light-emitting layers and the cathodes includes: sequentially evaporating an organic light-emitting material and a cathode metal on the substrate on which the aforementioned patterns are formed to form patterns of light-emitting layers 29 and cathodes 31. The light-emitting layer 29 is connected to the anode 27 in the pixel opening region defined by the pixel define layer 28, and the cathode 31 is disposed on the light emitting layer 29.

The cathode 31 may be made of one of metal materials such as magnesium (Mg), silver (Ag), aluminum (Al), copper (Cu), lithium (Li), or an alloy of the foregoing metals, or a cation exchange membrane.

After subsequent film layer (e.g., an encapsulation layer) preparation are completed, the display substrate may be stripped off from the glass carrier plate 1 by a stripping process, as shown in FIG. 8.

The structure shown in the present disclosure and the preparation process thereof are merely an exemplary description. In an exemplary implementation, corresponding structures may be changed and patterning processes may be added or reduced according to actual needs. For example, the thin film transistor may be not only a top gate structure, but alternatively a bottom gate structure, or may be not only a dual gate structure, but alternatively a single gate structure.

Other electrodes, leads and structural film layers may also be disposed in the driving structure layer and the light-emitting structure layer.

Figure 15:
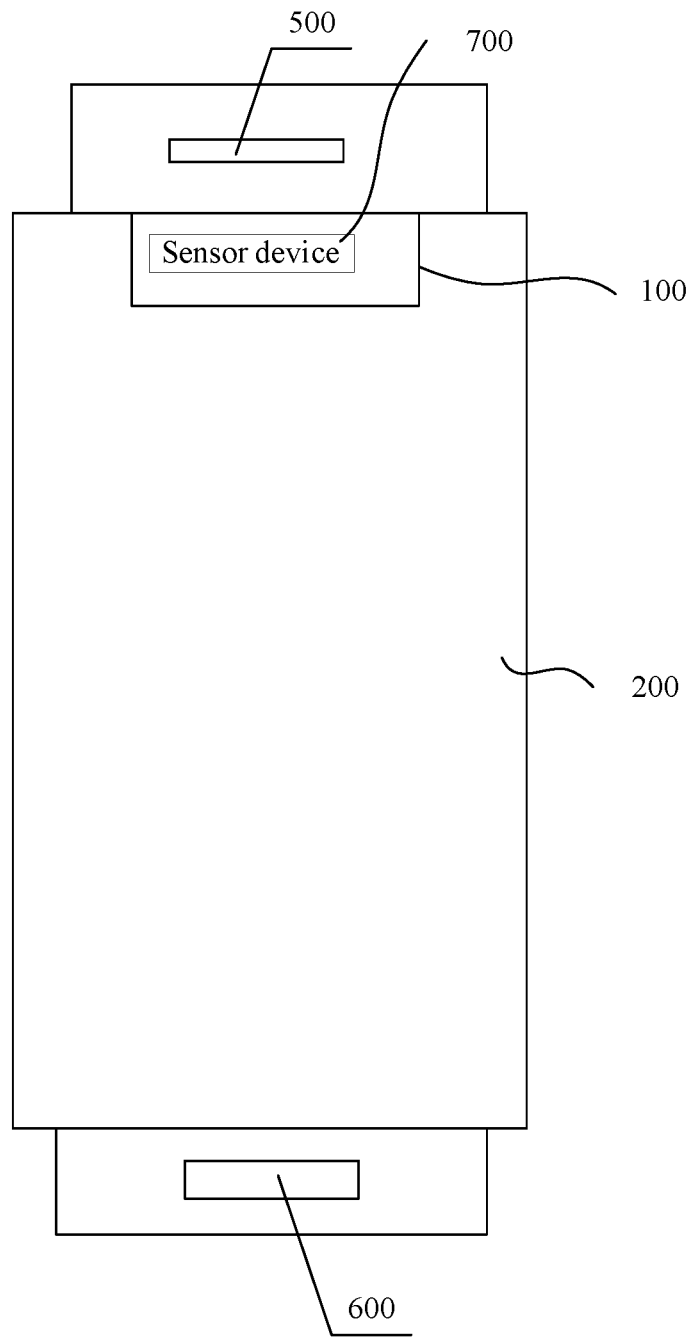
FIG. 15 is a schematic diagram of a display apparatus according to an embodiment.

As shown in FIG. 15, an embodiment of the present disclosure provides a display apparatus, which includes the aforementioned display substrate.

In an exemplary embodiment, the display apparatus may further include a first driving chip 500 and a second driving chip 600, the first driving chip 500 is electrically connected to the passive light-emitting device (not shown) and the second driving chip 600 is electrically connected to the pixel drive circuit (not shown). The first driving chip 500 inputs a driving signal to the passive light-emitting device through a second driving signal line (not shown), and the second driving chip 600 inputs a driving signal to the active light-emitting device through the pixel drive circuit. In the solution provided in the present embodiment, different driving chips are used to drive the first display region 100 and the second display region 200.

In an exemplary embodiment, the display apparatus may further include a sensor device 700, which is disposed in the first display region 100, and a photosensitive surface of the sensor device 700 is consistent with a light-emergence side of the display substrate. The sensor device 700 includes, for example, at least one of a camera, an infrared sensor, a face recognition (Face ID) sensor, and the like.

In an exemplary embodiment, the display apparatus may include a full-screen display apparatus.

In an exemplary embodiment, a display apparatus may be any product or component with a display function such as a mobile phone, a tablet computer, a television, a display, a laptop computer, a digital photo frame, a navigator, etc.

Figure 16:
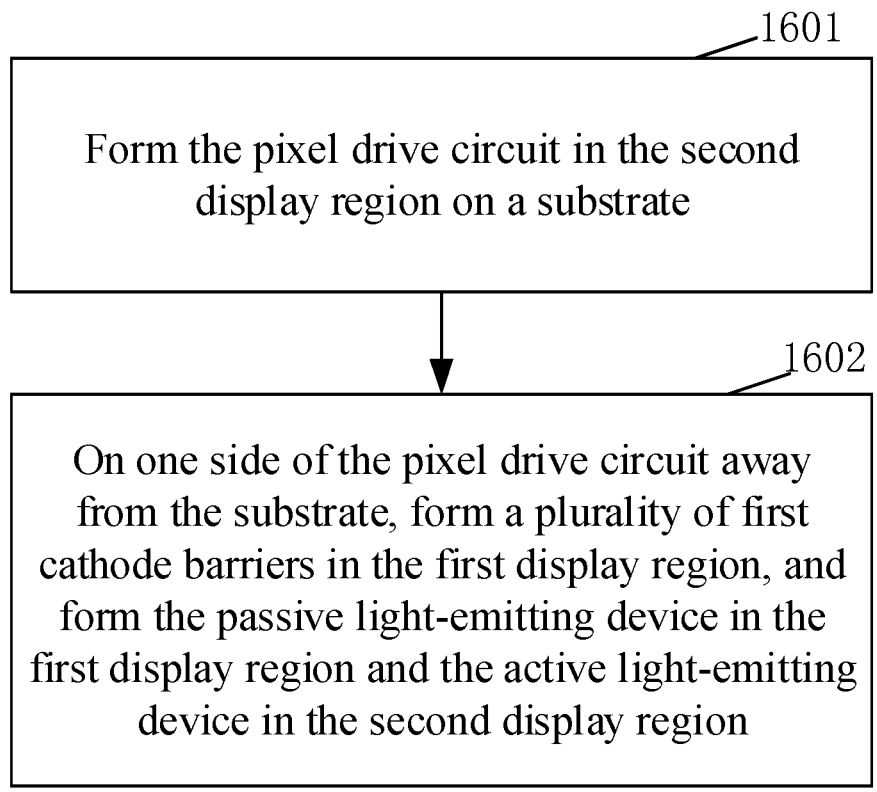
FIG. 16 is a flowchart of a preparation method of a display substrate according to an embodiment.

As shown in FIG. 16, an embodiment of the present disclosure further provides a preparation method of a display substrate including a first display region and a second display region, wherein the first display region includes a plurality of first pixels distributed in an array; the first pixel includes a passive light-emitting device, the second display region includes a plurality of second pixels, the second pixel includes an active light-emitting device and a pixel drive circuit electrically connected to the active light-emitting device, the preparation method includes the following acts 1601-1602.

In act 1601, a pixel drive circuit is formed in the second display region on a substrate.

In step 1602, on a side of the pixel drive circuit away from the substrate, a plurality of first cathode blockers are formed in the first display region, and the first cathode blocker includes at least one first groove, wherein the first cathode blocker is provided between at least two adjacent columns of first pixels, to make the cathodes of the two adjacent columns of first pixels disconnected; and the passive light-emitting device is formed in the first display region and the active light-emitting device is formed in the second display region, and the active light-emitting device is electrically connected to the pixel drive circuit.

In an exemplary embodiment, the forming the pixel drive circuit in the second display region on a substrate includes:
sequentially forming an active layer, a gate electrode, a source electrode and a drain electrode in the second display region on the substrate;
forming a plurality of first cathode blockers in the first display region includes:
forming a first insulating layer on a side of the source electrode and the drain electrode away from the substrate;
forming a second insulating layer provided with a first via on a side of the first insulating layer away from the substrate, wherein the first via exposes the first insulating layer;
forming an anode of the active light-emitting device and an anode of the passive light-emitting device on a side of the second insulating layer away from the substrate;
forming a pixel define layer on a side of the anode away from the substrate, the pixel define layer is provided with a second via and a pixel opening region, wherein the second via exposes the first via, and the pixel opening region exposes the anode;
forming an anode protection layer provided with a third via on a side of the pixel define layer away from the substrate, wherein the third via exposes the first via and the second via;
etching the second insulating layer through dry etch to form the first groove;
removing the anode protection layer;
forming a light-emitting layer in the pixel opening region on a side of the pixel define layer away from the substrate;
forming a cathode inhibitor layer on a side of the light-emitting layer away from the substrate, wherein on a plane parallel to the display substrate, an orthographic projection of the first groove and an orthographic projection of the cathode inhibitor layer of the same first cathode blocker are alternately disposed.

In an exemplary embodiment, a second groove surrounding an edge of the first display region is formed on a side of the first display region facing the second display region through the same patterning process while the first groove is prepared, to make the cathodes of the first display region and the second display region disconnected.

In the present embodiment, the structures, materials, relevant parameters and detailed preparation processes of various film layers have been described in detail in the above embodiments, and will not be described here again.

According to the preparation method provided in the present embodiment, the passive light-emitting device is disposed in the first display region. Since the passive light-emitting device does not need to be provided with a pixel drive circuit, there will be no pixel drive circuit or related metal wiring placed in the first display region, thus the light transmittance is high, and it is convenient to place front cameras, sensors (such as face recognition sensors, etc.), earphones and other elements, thereby achieving a full-screen design while increasing the screen-to-body ratio. In addition, a cathode blocker is disposed between at least two adjacent columns of first pixels, so that the first pixels in different columns may be driven respectively, improving the duty ratio. In addition, the preparation method of the present embodiment may be achieved by using existing mature preparation device, has small modification on the existing process, may be well compatible with the existing preparation process, and therefore has the advantages of low manufacturing cost, easy process realization, high product efficiency and high yield and the like. The solution provided by the present embodiment may achieve a full-screen and has a good application prospect.

The drawings in the present disclosure only refer to the structures involved in the embodiments of the present disclosure, and common designs may be referred to for other structures. The features in the aforementioned embodiments may be combined with each other to obtain a new embodiment if there is no conflict. Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising: a first display region and a second display region, wherein the first display region comprises a plurality of first pixels, the first pixel comprises a passive light-emitting device, the second display region comprises a plurality of second pixels, the second pixel comprises an active light-emitting device and a pixel drive circuit electrically connected to the active light-emitting device; the first display region further comprises a plurality of first cathode blockers, and the first cathode blocker comprises at least one first groove, wherein the first cathode blocker is provided between at least two adjacent columns of first pixels, to make cathodes of the two adjacent columns of first pixels disconnected.

2. The display substrate according to claim 1, wherein on a plane parallel to the display substrate, an orthographic projection of an opening of the first groove away from a substrate of the display substrate is located within an orthographic projection of an opening of the first groove close to the substrate.

3. The display substrate according to claim 1, wherein the first cathode blocker comprises a plurality of the first grooves and a plurality of cathode inhibitor layers; on a plane parallel to the display substrate, an orthographic projection of the first groove and an orthographic projection of the cathode inhibitor layer are alternately disposed in a same first cathode blocker.

4. The display substrate according to claim 3, wherein on the plane parallel to the display substrate, orthographic projections of the first grooves of the plurality of first cathode blockers are arranged along a first direction, and orthographic projections of the cathode inhibitor layers of the plurality of first cathode blockers are arranged along the first direction, the first direction is perpendicular to an extending direction of an orthographic projection of the first cathode blocker.

5. The display substrate according to claim 3, wherein on the plane parallel to the display substrate, the orthographic projection of the first groove overlaps with an orthographic projection of an adjacent cathode inhibitor layer in a same first cathode blocker.

6. The display substrate according to claim 3, wherein, on a cross-section perpendicular to the display substrate, the display substrate comprises a driving structure layer and a light-emitting structure layer sequentially disposed on a substrate, wherein the driving structure layer comprises a source-drain electrode layer disposed on the substrate, and the source-drain electrode layer comprises a source electrode and a drain electrode disposed in the second display region; the light-emitting structure layer comprises a first electrode layer, a pixel define layer, a light-emitting layer and a second electrode layer which are sequentially disposed, wherein the first electrode layer comprises an anode of the passive light-emitting device and an anode of the active light-emitting device, the second electrode layer comprises a cathode of the passive light-emitting device and a cathode of the active light-emitting device, the cathode inhibitor layer is disposed between the light-emitting layer and the second electrode layer, and the first groove is disposed on a side of the source-drain electrode layer away from the substrate.

7. The display substrate according to claim 3, wherein the first pixel comprises a first color sub-pixel, a second color sub-pixel and a third color sub-pixel; the first color sub-pixel and the second color sub-pixel are disposed in a same row, and the third color sub-pixel is located in a row adjacent to a row where the first color sub-pixel and the second color sub-pixel are located; and the row where the first color sub-pixel is located and the row where the third color sub-pixel is located are alternately arranged in the first display region.

8. The display substrate according to claim 7, wherein the cathode inhibitor layer is disposed between every two adjacent third color sub-pixels in a same row of the first display region.

9. The display substrate according to claim 7, wherein in a same row of the first display region, the first groove is disposed between the first color sub-pixel and the second color sub-pixel which are adjacent and located at different first pixels.

10. The display substrate according to claim 1, wherein a side of the first display region facing the second display region is provided with a second cathode blocker surrounding an edge of the first display region, to make cathodes of the first display region and cathodes of the second display region disconnected.

11. The display substrate according to claim 10, wherein the second cathode blocker comprises a second groove, and on a plane parallel to the display substrate, an orthographic projection of the second groove surrounds an edge of a side of an orthographic projection of the first display region facing the second display region.

12. The display substrate according to claim 11, wherein the second groove and the first groove are disposed in a same layer.

13. The display substrate according to claim 1, wherein the first display region further comprises a plurality of first driving signal lines and a plurality of second driving signal lines, and anodes of passive light-emitting devices in sub-pixels of the same color of first pixels in a same row are electrically connected to one of the second driving signal lines; cathodes of passive light-emitting devices of first pixels in a same column are electrically connected to one of the first driving signal lines.

14. The display substrate according to claim 1, wherein a pixel distribution density of the first display region is smaller than a pixel distribution density of the second display region.

15. A display apparatus, comprising the display substrate of claim 1.

16. The display apparatus according to claim 15, further comprising: a first driving chip and a second driving chip, wherein the first driving chip is electrically connected to the passive light-emitting device, and the second driving chip is electrically connected to the pixel drive circuit.

17. The display apparatus according to claim 15, further comprising: a sensor device, wherein the sensor device is disposed in the first display region, and a photosensitive surface of the sensor device is consistent with a light emergence side of the display substrate.

18. A preparation method of a display substrate, wherein the display substrate comprises a first display region and a second display region, the first display region comprises a plurality of first pixels distributed in an array; the first pixel comprises a passive light-emitting device, the second display region comprises a plurality of second pixels, the second pixel comprises an active light-emitting device and a pixel drive circuit electrically connected to the active light-emitting device; the preparation method comprises:

forming the pixel drive circuit in the second display region on a substrate; and on a side of the pixel drive circuit away from the substrate, forming a plurality of first cathode blockers in the first display region, and the first cathode blocker comprises at least one first groove; wherein, the first cathode blocker is provided between at least two adjacent columns of first pixels, to make cathodes of the two adjacent columns of first pixels disconnected; and, forming the passive light-emitting device in the first display region and the active light-emitting device in the second display region, and the active light-emitting device is electrically connected to the pixel drive circuit.

19. The preparation method of the display substrate according to claim 18, wherein forming the pixel drive circuit in the second display region on the substrate comprises:

sequentially forming an active layer, a gate electrode, a source electrode and a drain electrode in the second display region on the substrate;

forming the plurality of first cathode blockers in the first display region comprises:

forming a first insulating layer on a side of the source electrode and the drain electrode away from the substrate;

forming a second insulating layer provided with a first via on a side of the first insulating layer away from the substrate, wherein the first via exposes the first insulating layer;

forming an anode of the active light-emitting device and an anode of the passive light-emitting device on a side of the second insulating layer away from the substrate;

forming a pixel define layer on a side of the anodes away from the substrate, wherein the pixel define layer is provided with a second via and a pixel opening region, and the second via exposes the first via, and the pixel opening region exposes the anodes;

forming an anode protection layer provided with a third via on a side of the pixel define layer away from the substrate, wherein the third via exposes the first via and the second via;

etching the second insulating layer through dry etch to form the first groove;

removing the anode protection layer;

forming a light-emitting layer in the pixel opening region on a side of the pixel define layer away from the substrate; and forming a cathode inhibitor layer on a side of the light-emitting layer away from the substrate, wherein on a plane parallel to the display substrate, an orthographic projection of the first groove and an orthographic projection of the cathode inhibitor layer of a same first cathode blocker are alternately disposed.

20. The preparation method of the display substrate according to claim 19, further comprising: while the first groove is prepared, forming a second groove surrounding an edge of the first display region on a side of the first display region facing the second display region through a same patterning process, to make cathodes of the first display region and cathodes of the second display region disconnected.

* * * * *